United States Patent
Kato et al.

(10) Patent No.: US 12,340,977 B2
(45) Date of Patent: Jun. 24, 2025

(54) PLASMA SOURCE AND PLASMA PROCESSING APPARATUS

(71) Applicant: Tokyo Electron Limited, Tokyo (JP)

(72) Inventors: Kenta Kato, Yamanashi (JP); Taro Ikeda, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 403 days.

(21) Appl. No.: 17/902,642

(22) Filed: Sep. 2, 2022

(65) Prior Publication Data
US 2023/0081103 A1 Mar. 16, 2023

(30) Foreign Application Priority Data

Sep. 13, 2021 (JP) ................................ 2021-148890

(51) Int. Cl.
*H01J 37/32* (2006.01)
(52) U.S. Cl.
CPC .... *H01J 37/32238* (2013.01); *H01J 37/3244* (2013.01)
(58) Field of Classification Search
None
See application file for complete search history.

(56) References Cited

U.S. PATENT DOCUMENTS

| | | | | |
|---|---|---|---|---|
| 2014/0339981 | A1* | 11/2014 | Komatsu | H01J 37/3222 315/34 |
| 2014/0361684 | A1* | 12/2014 | Ikeda | H01J 37/32266 315/34 |
| 2015/0348758 | A1* | 12/2015 | Miyashita | H01J 37/3244 333/33 |
| 2016/0177448 | A1* | 6/2016 | Ikeda | H01J 37/32449 118/723 AN |
| 2023/0031447 | A1* | 2/2023 | Ikeda | H01J 37/32247 |
| 2023/0081103 | A1* | 3/2023 | Kato | H01J 37/3244 315/111.21 |

FOREIGN PATENT DOCUMENTS

| | | |
|---|---|---|
| JP | 2014049529 A | 3/2014 |
| JP | 2017150023 A | 8/2017 |

\* cited by examiner

*Primary Examiner* — Srinivas Sathiraju
(74) *Attorney, Agent, or Firm* — Fenwick & West LLP

(57) ABSTRACT

A plasma source comprising: a plasma generator including a first wall having an opening and a second wall facing the first wall, and forming a plasma generating space; a dielectric window disposed on the first wall to block the opening and configured to transmit electromagnetic waves to the plasma generating space; and a protruding portion disposed on the second wall, protruding from the second wall to be close to the dielectric window, and containing a conductor at least partially. The protruding portion has a gas hole that opens toward the dielectric window.

13 Claims, 7 Drawing Sheets

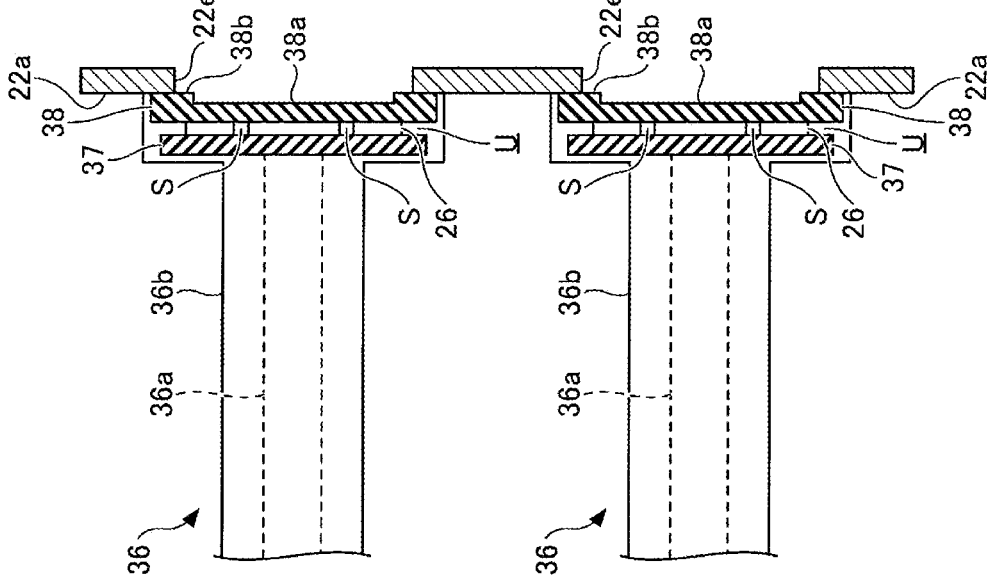
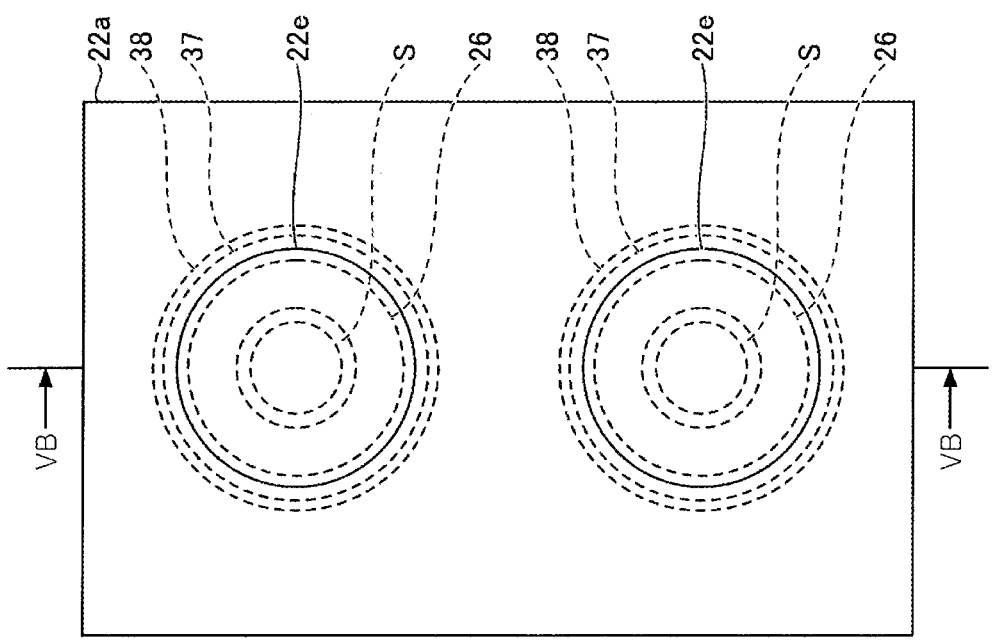

PLASMA SOURCE AND PLASMA PROCESSING APPARATUS

CROSS-REFERENCE TO RELATED APPLICATIONS

This application claims priority to Japanese Patent Application No. 2021-148890 filed on Sep. 13, 2021, the entire contents of which are incorporated herein by reference.

TECHNICAL FIELD

The present disclosure relates to a plasma source and a plasma processing apparatus.

BACKGROUND

It is important to perform film formation using plasma in order to obtain a high-quality film at a low temperature. In recent years, thin film formation has progressed in film formation, and film formation by a plasma atomic layer deposition (ALD) method has been employed. While a high-quality thin film can be obtained at a low temperature by using plasma, electrical damage or physical damage to the film due to the plasma may be a problem. In order to solve this problem, film formation by an ALD method using a remote source has been suggested.

For example, Japanese Laid-open Patent Publication No. 2017-150023 and No. 2014-49529 disclose a configuration of a remote plasma processing apparatus having an inductively coupled plasma (ICP) type remote plasma source. In the case of using an ICP type remote source as a remote source in this manner, a range in which plasma is stable may be narrow and plasma ignition may not be easy.

SUMMARY

The present disclosure provides a technique capable of facilitating plasma ignition and improving gas decomposition efficiency.

In accordance with an aspect of the present disclosure, there is provided a plasma source comprising: a plasma generator including a first wall having an opening and a second wall facing the first wall, and forming a plasma generating space; a dielectric window disposed on the first wall to block the opening and configured to transmit electromagnetic waves to the plasma generating space; and a protruding portion disposed on the second wall, protruding from the second wall to be close to the dielectric window, and containing a conductor at least partially. The protruding portion has a gas hole that opens toward the dielectric window.

BRIEF DESCRIPTION OF THE DRAWINGS

The objects and features of the present disclosure will become apparent from the following description of embodiments, given in conjunction with the accompanying drawings, in which:

FIGS. 5A and 5B are diagrams showing an example of an electromagnetic wave supply;

DETAILED DESCRIPTION

Figure 1:
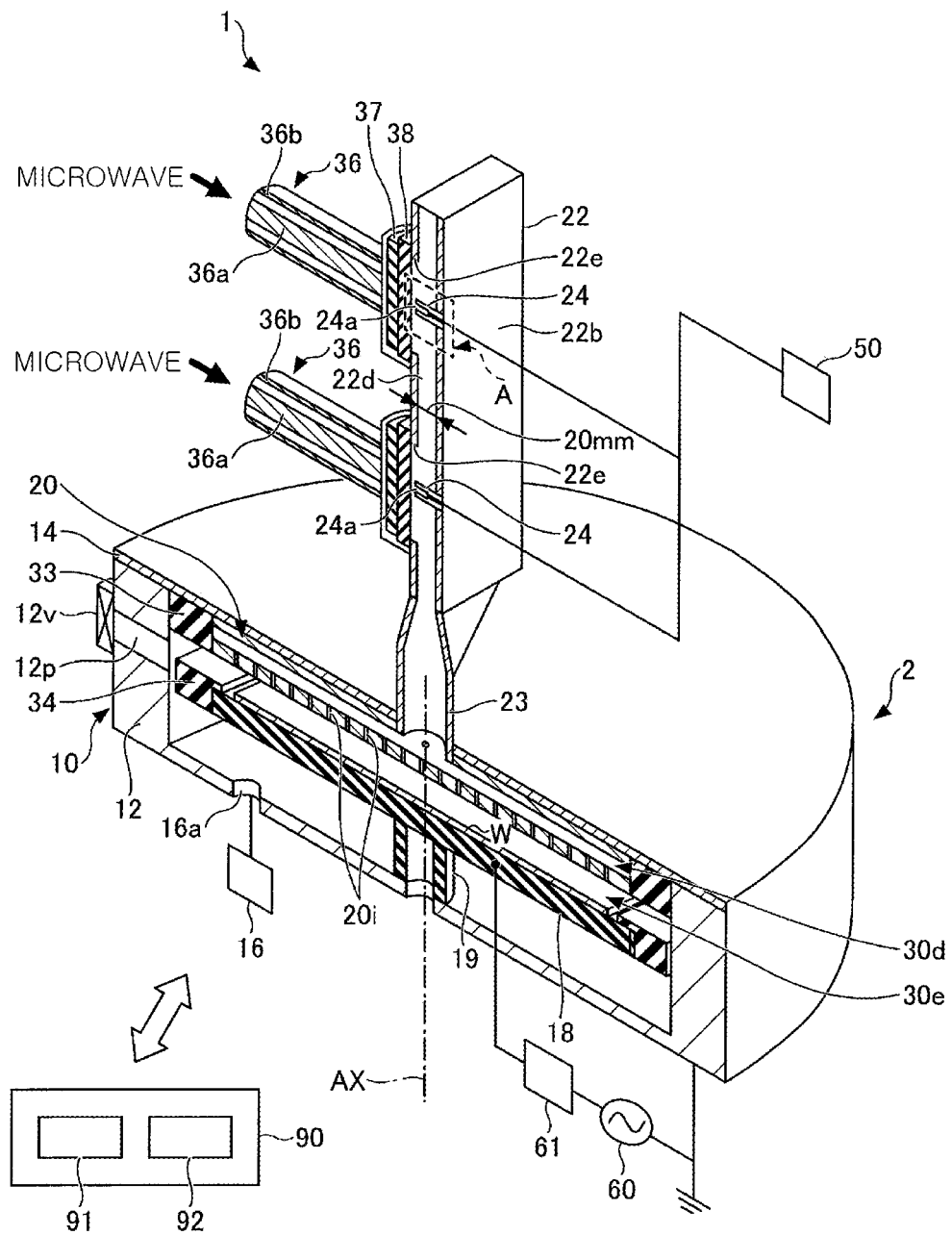
FIG. 1 is a cross-sectional perspective view showing a plasma processing apparatus according to a first embodiment.

Hereinafter, embodiments of the present disclosure will be described with reference to the accompanying drawings. In each drawing, the same components are denoted by the same reference numerals, and redundant description thereof may be omitted.

First Embodiment (Plasma Processing Apparatus)

Figure 2:
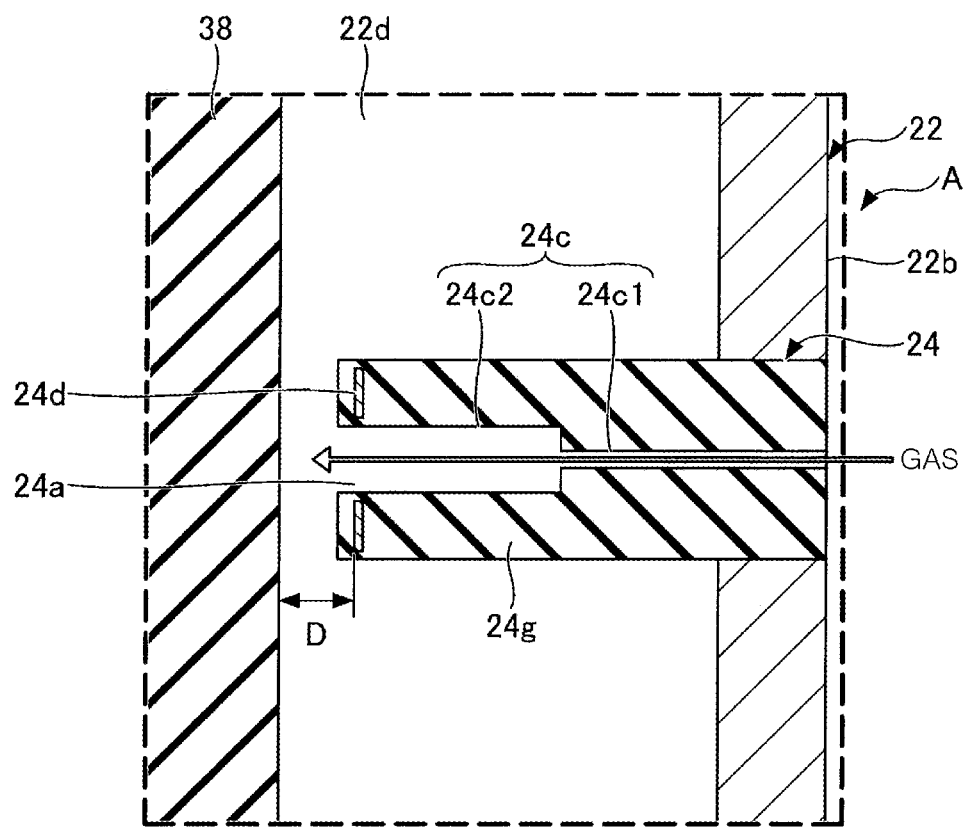
FIG. 2 is an enlarged view of an area A of a plasma source shown in FIG. 1.

A plasma processing apparatus 2 according to a first embodiment will be described with reference to FIGS. 1 and 2. FIG. 1 is a cross-sectional perspective view showing the plasma processing apparatus 2 according to the first embodiment. FIG. 2 is an enlarged view of the area A shown in FIG. 1.

The plasma processing apparatus 2 shown in FIG. 1 includes a plasma source 1. The plasma source 1 is disposed above the plasma processing apparatus 2 via a connecting portion 23. The plasma source 1 has a first chamber 22, electromagnetic wave supplies 36, and protruding portions 24. The first chamber 22 is a flat rectangular container extending in a direction of an axis AX as the central axis of the plasma processing apparatus 2. An example of a plasma generator includes the first chamber 22 and the electromagnetic wave supplies 36. In the first embodiment, the plasma generator is disposed outside the plasma processing apparatus 2.

Among the walls forming the first chamber 22, two facing walls having the largest area are referred to as a "first wall 22a" (see FIG. 4) and a "second wall 22b." The first chamber 22 has a plasma generating space 22d therein. An opening 22e is formed in the first wall 22a. A dielectric window 38 is made of ceramic (dielectric) such as alumina ($Al_2O_3$) or the like, and is configured to transmit electromagnetic waves such as microwaves or the like. The dielectric window 38 is disposed along the wall surface of the first wall 22a to close the opening 22e. The dielectric window 38 is disposed at the tip of the electromagnetic wave supply 36, and transmits the electromagnetic waves supplied from the electromagnetic wave supply 36 to the plasma generating space 22d. The electromagnetic waves include microwaves. The microwaves have a frequency band of 300 MHz to 3 THz. The electromagnetic waves may include VHF waves having a frequency band of 150 MHz to 300 MHz.

The protruding portion 24 is disposed on the second wall 22b, protrudes from the second wall 22b to be adjacent to the dielectric window 38, and at least partially includes a conductor. The conductor functions as an electrode. The protruding portion 24 is provided with a gas hole 24c that opens toward the dielectric window 38. The configuration and function of the protruding portion 24 will be described later.

The gas hole 24c of the protruding portion 24 is connected to a gas supply 50 and supplies a reducing gas from the gas supply 50 to the plasma generating space 22d. In the first chamber 22, the gas supplied from the gas hole 24c of the protruding portion 24 is decomposed by the electric field of the electromagnetic waves supplied from the electromagnetic wave supply 36 to generate plasma in the plasma generating space 22d. Radicals in the generated plasma are supplied to the plasma processing apparatus 2 and used for processing a substrate W. The plasma processing apparatus 2 includes a second chamber 10. A processing gas other than the reducing gas may be directly supplied to a processing chamber 30e from the sidewall of the second chamber 10, for example.

In the embodiment, the second chamber 10 has a chamber body 12. The chamber body 12 is formed in a substantially cylindrical shape, and has an opening at its upper portion. The chamber body 12 provides a sidewall and a bottom portion of the second chamber 10. The chamber body 12 is made of metal such as aluminum or the like. The chamber body 12 is grounded.

The second chamber 10 further has an upper wall 14. The upper wall 14 is made of metal such as aluminum or the like. The upper wall 14 closes the upper opening of the chamber body 12. The upper wall 14 is grounded together with the chamber body 12.

The plasma processing apparatus 2 further includes a substrate support 18. The substrate support 18 is disposed in the second chamber 10. The substrate support 18 is configured to support the substrate W placed thereon. The substrate W is placed on the substrate support 18 in a substantially horizontal state. The substrate support 18 may be supported by a support member 19. The support member 19 extends upward from the bottom portion of the second chamber 10. The substrate support 18 and the support member 19 can be made of a dielectric material such as aluminum nitride or the like.

The plasma processing apparatus 2 further includes a shower head 20. The shower head 20 is made of metal such as aluminum or the like. The shower head 20 is formed in a substantially disc shape, and has a hollow structure. The shower head 20 shares the axis AX as its central axis. The shower head 20 is disposed above the substrate support 18 and below the upper wall 14. The shower head 20 constitutes a ceiling that defines an inner space of the second chamber 10.

The second chamber 10 has the processing chamber 30e for processing the substrate W between the shower head 20 and the substrate support 18. The substrate W is processed in the processing chamber 30e. The second chamber 10 has the axis AX as its central axis. The axis AX is an axis extending vertically through the center of the second chamber 10.

A sidewall of the chamber body 12 provides a passage 12p. The substrate W passes through the passage 12p when being transferred between the inside and outside of the second chamber. The passage 12p can be opened and closed by a gate valve 12v. The gate valve 12v is disposed along the sidewall of the chamber body 12.

The bottom portion of the second chamber 10 provides an exhaust port 16a. The exhaust port 16a is connected to an exhaust device 16. The exhaust device 16 includes a pressure controller such as an automatic pressure control valve and a vacuum pump such as a turbo molecular pump.

The shower head 20 has a diffusion chamber 30d therein. The shower head 20 provides a plurality of gas through-holes 20i penetrating through the shower head 20 in a thickness direction thereof, and the plurality of gas through-holes 20i are opened to the bottom surface of the shower head 20. The shower head 20 forms a gas passage for introducing gas from the diffusion chamber 30d into the processing chamber 30e through the plurality of gas through-holes 20i. Accordingly, radicals generated in the first chamber 22 and other gas, if necessary, are introduced into the processing chamber 30e. The substrate support 18 also functions as a lower electrode, and the shower head 20 also functions as an upper electrode.

The outer circumference of the shower head 20 is covered with a dielectric member 33 made of aluminum oxide or the like. The outer circumference of the substrate support 18 is covered with a dielectric member 34 made of aluminum oxide or the like. When high frequency is not supplied to the shower head 20, the dielectric member 33 may be omitted. However, it is preferable to provide the dielectric member 33 in order to define the area of the shower head 20 that functions as an electrode facing the substrate support 18. Further, it is preferable to provide the dielectric member 33 in order to make the ratio of an anode and a cathode of the electrode as uniform as possible.

A high-frequency power supply 60 is connected to the substrate support 18 via a matching device 61. The matching device 61 has an impedance matching circuit. The impedance matching circuit is configured to match an impedance of a load side (substrate support 18 side) with an output impedance of the high-frequency power supply 60. The frequency of the high-frequency wave supplied from the high-frequency power supply 60 is lower than the frequencies of the VHF waves and the microwaves supplied to the plasma source 1, which will be described later, and is 60 MHz or less. The frequency of the high-frequency wave may be 13.56 MHz. The high-frequency power supply 60 may be connected to the substrate support 18 or the shower head 20 via the matching device 61. The radicals transferred from the plasma source 1 to the plasma processing apparatus 2 are re-dissociated by the high-frequency power applied to the plasma processing apparatus 2, and used for processing the substrate W.

(Plasma Source)

Figure 3:
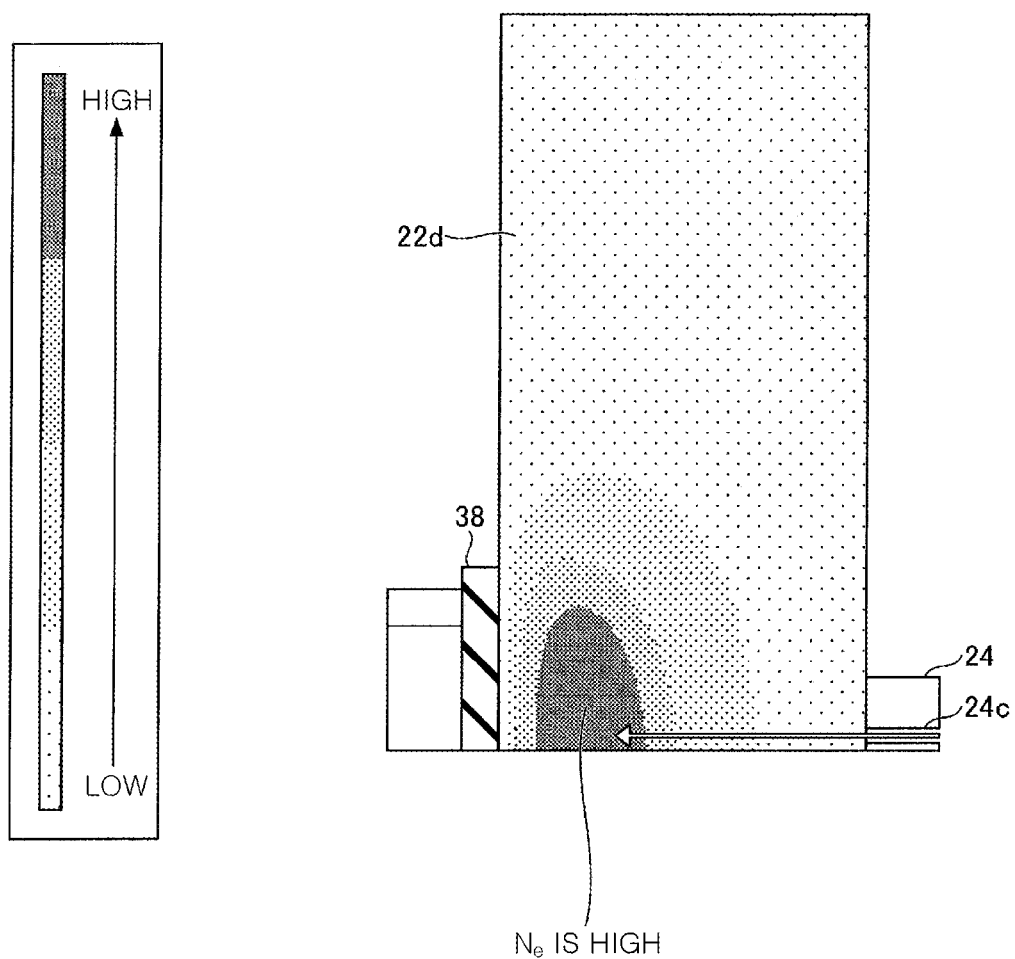
FIG. 3 is a diagram showing an example of a simulation result of a plasma electron density.

The plasma source 1 will be described in more detail with reference to FIG. 3 in addition to FIGS. 1 and 2. FIG. 3 is a diagram showing an example of a simulation result of plasma electron density. The plasma source 1 has the connecting portion 23 fixed on the upper wall 14. The structure is such that the first chamber 22 is disposed on the connecting portion 23 and the radicals (active species) in the plasma generated in the first chamber 22 are supplied to the plasma processing apparatus 2 via the connecting portion 23.

The connecting portion 23 is a substantially cylindrical hollow member made of metal such as aluminum or the like, and shares the axis AX as its central axis. The lower end of the connecting portion 23 communicates with an opening formed at the center of the upper wall 14 of the second chamber 10.

The first chamber 22 is a flat rectangular waveguide having the center thereof on the axis AX. The upper end of the connecting portion 23 extends in the width direction of the flat first chamber 22, and is connected to the lower end of the first chamber 22. The first chamber 22 is configured to form the flat plasma generating space 22d therein. The first chamber 22 and the connecting portion 23 are made of a conductor such as aluminum or the like, and have a ground potential.

Referring to FIG. 2, which is an enlarged view of the area A of FIG. 1, the protruding portion 24 has a columnar shape, and is entirely made of a dielectric 24g such as alumina, AlN, quartz, or the like. The protruding portion 24 penetrates through the second wall 22b and protrudes from the second wall 22b. The gas hole 24c is formed inside the protruding portion 24 so as to penetrate the protruding portion 24. The gas hole 24c has a thin hole 24c1 and a diameter-enlarged portion 24c2 enlarged from the thin hole 24c1. An opening 24a formed at the tip of the gas hole 24c opens from the diameter-enlarged portion 24c2 toward the dielectric window 38. The reducing gas is supplied from the gas hole 24c into the plasma generating space 22d. Accordingly, the protruding portion 24 serves as a gas nozzle. The function of the protruding portion 24 as a plasma ignition source will be described later.

The gas hole 24c of the protruding portion 24 discharges gas toward the dielectric window 38. Therefore, the efficiency of gas decomposition and the efficiency of generating radicals can be improved by injecting the gas into the range where the energy of the electromagnetic wave is concentrated. FIG. 3 is a diagram showing an example of a simulation result of a plasma electron density $N_e$ in the plasma generating space 22d. As a condition for the simulation of the present disclosure, argon gas was supplied from the gas hole 24c. A model in which the tip of the protruding portion 24 does not protrude from the second wall 22b was adopted. A pressure in the plasma generating space 22d was set to 10 Pa, and microwaves having a frequency of 860 MHz were supplied through the dielectric window 38.

As a result of the simulation, as shown in FIG. 3, the plasma electron density $N_e$ in the plasma generating space 22d near the dielectric window 38 increases. The plasma electron density $N_e$ was higher near the center of the dielectric window 38 and decreased away from the center of the dielectric window 38. From the above result, it can be seen that the vicinity of the dielectric window 38 is a range in which energy is concentrated.

Therefore, in the present embodiment, the protruding portion 24 protrudes in a direction of an arrow in FIG. 3, and the gas is supplied from the tip of the protruding portion 24 toward the dielectric window 38. Thus, the gas can be supplied to the region of the plasma generating space 22d where the plasma electron density $N_e$ is high. Accordingly, by injecting the gas into the range near the dielectric window 38 where the energy is concentrated, the efficiency of gas decomposition and the efficiency of generating radicals can be improved.

Figure 4:
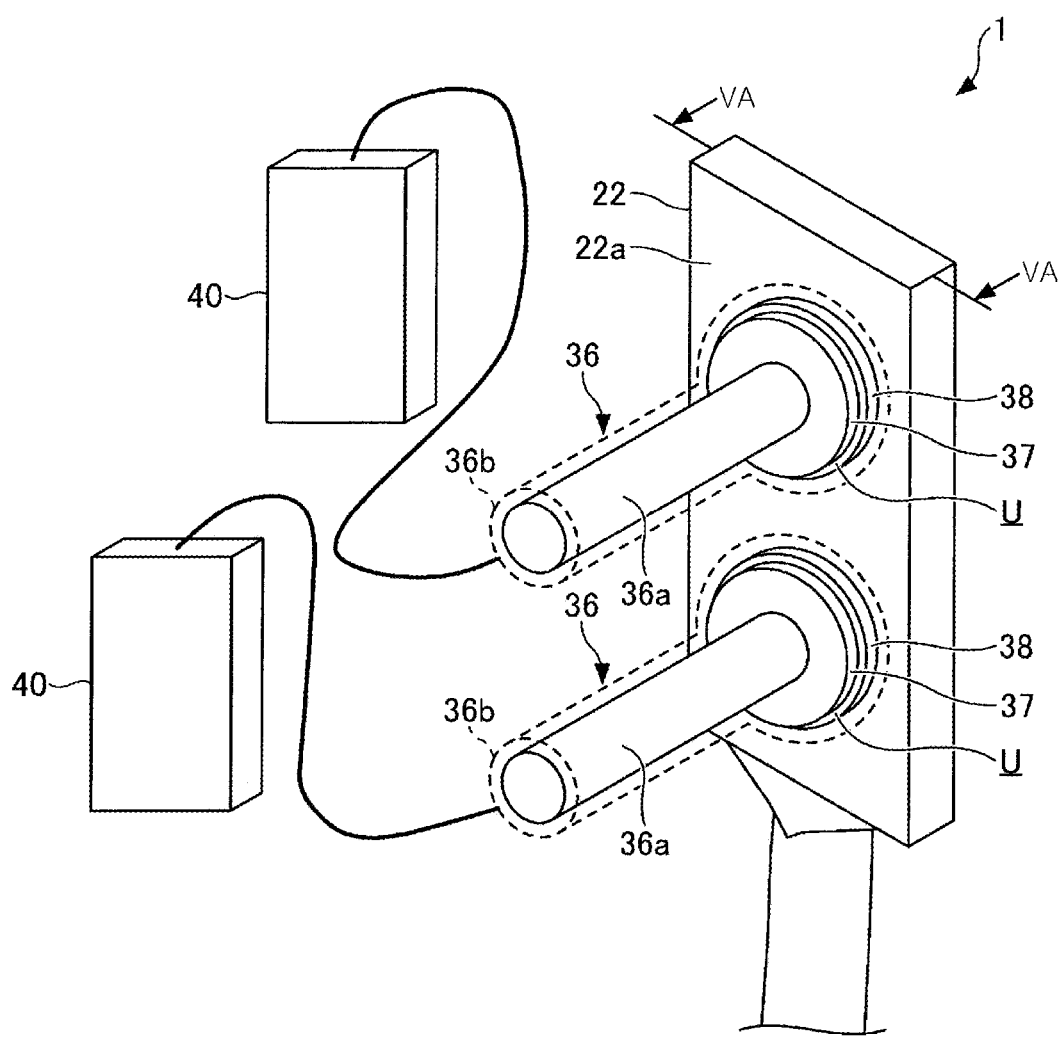
FIG. 4 is a perspective view showing the plasma source according to the first embodiment.

Further, the description will be continued with reference to a perspective view of FIG. 4 showing the plasma source 1 according to the first embodiment. The plasma source 1 has the electromagnetic wave supplies 36 connected to the first wall 22a of the first chamber 22. Referring to FIGS. 1 and 4, two electromagnetic wave supplies 36 having their centers on the axis AX are provided on the first wall 22a of the walls constituting the first chamber 22 and in the longitudinal direction (vertical direction) of the first chamber 22. The two electromagnetic wave supplies 36 have the same configuration.

The electromagnetic wave supply 36 has the dielectric window 38 at the tip thereof, and is configured to supply electromagnetic waves into the first chamber 22 through the dielectric window 38. In the present embodiment, the microwaves propagate from a microwave oscillator 40 to the electromagnetic wave supply 36 via an input port. The electromagnetic wave supply 36 has a coaxial waveguide structure, and has a substantially cylindrical inner conductor 36a and a substantially cylindrical outer conductor 36b concentrically disposed around the inner conductor 36a. The microwaves propagate between the inner conductor 36a and the outer conductor 36b, transmit through a substantially disc-shaped quartz member 37, and propagate to the dielectric window 38 through a slot S of an antenna 26 provided at a gap U (see FIG. 5) between the quartz member 37 and the dielectric window 38. A space may be provided between the inner conductor 36a and the outer conductor 36b. Alternatively, alumina or the like may be disposed therebetween. The microwaves transmit through the dielectric window 38, and are radiated into the first chamber 22 through the opening 22e of the first wall 22a of the first chamber 22. The inner conductor 36a, the quartz member 37, and the dielectric window 38 are covered with the outer conductor 36b.

FIG. 5A shows a cross section taken along a line VA-VA of FIG. 4, and is a plan view showing the vicinity of the opening 22e of the first wall 22a from the inner wall side of the first wall 22a. FIG. 5B is a diagram showing a cross section taken along a line VB-VB passing through the center of the opening 22e shown in FIG. 5A. As shown in FIG. 5A, the antenna 26 that is a conductor is in contact with the surface opposite to the surface of the dielectric window 38 exposed through the opening 22e, forming the donut-shaped (annular) slot S.

As shown in FIG. 5B, the surface of the dielectric window 38 exposed from the opening 22e is circularly recessed at a central region 38a of the dielectric window 38, and the central region 38a is thinner than an outer peripheral region 38b of the dielectric window 38. Accordingly, the characteristics of plasma ignition can be improved. However, the central region 38a may not be recessed.

In the present embodiment, two electromagnetic wave supplies 36 are disposed in the vertical direction on the first wall 22a, however, three or more electromagnetic wave supplies may be disposed, or only one electromagnetic wave supply may be disposed. As the number of electromagnetic wave supplies 36 increases, the efficiency of generating radicals and the efficiency of generating plasma increase.

With this configuration, the vicinity of the upper electromagnetic wave supply 36 of the electromagnetic wave supplies 36 disposed in the vertical direction serves as a first dissociation area where gas dissociation is promoted. Further, the vicinity of the lower electromagnetic wave supply 36 serves as a second dissociation area where gas dissociation is promoted. Since the gas dissociated in the first dissociation area is further dissociated in the second dissociation area, the degree of gas dissociation increases as it goes downward in the vertical direction in the plasma generating space 22d in the first chamber 22. Hence, high-density plasma is generated in the first chamber 22. Accordingly, the connecting portion 23 can supply sufficient radicals to the second chamber 10.

In this manner, radicals are supplied from the plasma source 1 to the processing chamber 30e between the substrate support 18 (lower electrode) and the shower head 20 (upper electrode), and the substrate W placed on the substrate support 18 is processed. In this case, radicals flow from the plasma source 1 through the shower head 20 through the plurality of gas through-holes 20i provided in the shower head 20, and are supplied to the processing chamber 30e. The radicals supplied to the processing chamber 30e may be recombined to gas during transfer. The radicals and the recombined gas are decomposed by the high-frequency power of the high-frequency power supply 60, and processing such as film formation is performed on the substrate W by the plasma generated thereby. By supplying radicals from the plasma source 1, even if the high-frequency power supplied from the high-frequency power supply 60 is small and the frequency thereof is relatively low, the gas dissociation sufficiently progresses and the supply of radicals can be increased. Accordingly, film formation can be performed on a substrate with less damage. Although not illustrated, gas that can be sufficiently dissociated only by the high-frequency power supply 60 may be supplied directly to the shower head 20 without passing through the plasma source 1.

The controller (control device) 90 can be a computer having a processor 91 and a memory 92. The controller 90 includes a calculation device, a storage device, an input device, a display device, a signal input/output interface, or the like. The controller 90 controls each component of the plasma processing apparatus 2 including the plasma source 1. In the controller 90, an operator can use the input device to input a command for managing the plasma processing apparatus 2. Further, the controller 90 can visualize and display an operation status of the plasma processing apparatus 2 using the display device. Further, the memory 92 of the controller 90 stores a control program and recipe data. The control program is executed by the processor 91 of the controller 90 in order to perform various processes in the plasma processing apparatus 2. The processor 91 executes the control program and controls each component of the plasma processing apparatus 2 to execute various processes, e.g., plasma processing method, in the plasma processing apparatus 2 based on the recipe data.

When an ICP type remote source is used as the remote source, the range in which plasma is stable may be narrow and plasma ignition may not be easy. On the other hand, according to the plasma processing apparatus 2 configured as described above, sufficient radicals can be supplied to the second chamber 10 using the plasma source 1 that activates the gas by generating plasma with electromagnetic waves having a relatively high frequency such as microwaves. Accordingly, a process with less damage to the substrate W can be performed using a remote plasma source using microwaves.

The plasma source 1 according to the present embodiment has the protruding portion 24. The protruding portion 24 is provided so as to protrude from the inner wall of the second wall 22b facing the dielectric window 38 in the first chamber 22, and to be spaced apart from the dielectric window 38.

At least a part of the protruding portion 24 contains a conductor. In the protruding portion 24 shown in FIG. 2, a conductor 24d is embedded in the dielectric 24g. The conductor 24d is made of metal such as aluminum or the like, and functions as an internal electrode. A distance D in the horizontal direction (direction perpendicular to the axis AX) from the tip of the conductor 24d to the surface of the dielectric window 38 is a distance at which the electric field near the tip of the conductor 24d is sufficiently low, and is preferably about 3 mm to 10 mm. However, if the distance D is about 5 mm to 10 mm, contamination, particles, and damage can be further suppressed, which is more preferable. The conductor 24d has a donut shape (annular shape), and is embedded near the end surface of the gas hole 24c and in the outer periphery of the diameter-enlarged portion 24c2. The conductor 24d is covered with the dielectric 24g forming the protruding portion 24, and is not exposed to the inner wall of the gas hole 24c.

In order to prevent abnormal discharge from occurring in the gas hole 24c due to the surface waves of the microwaves, the gas hole 24c has at the tip thereof the diameter-enlarged portion 24c2 that expands from the thin hole 24c1 of the gas hole 24c and opens toward the dielectric window 38. The diameter-enlarged portion 24c2 has a cylindrical shape. The diameter-enlarged portion 24c2 is not limited to a cylindrical shape, and may be a prismatic shape having a bottom surface of polygon such as a quadrangle, a pentagon, or the like.

The depth (length) of the diameter-enlarged portion 24c2 from the tip of the gas hole 24c is 5 mm or more. The diameter of the thin hole 24c1 of the gas hole 24c is smaller than 1 mm, for example 0.3 mm. The diameters of the diameter-enlarged portion 24c2 and the opening 24a are 3 mm or more, and ⅛ or less of a surface wave wavelength $\lambda$ of the microwave in the plasma.

The surface wave wavelength $\lambda$ of the microwave in the plasma is about ⅓ of a wavelength $\lambda 0$ of the microwave in vacuum. Since the wavelength $\lambda 0$ used in the microwave plasma process is about 120 mm to 480 mm, the surface wave wavelength $\lambda$ of the microwave in the plasma is about 40 mm to 160 mm. Therefore, the diameters of the diameter-enlarged portion 24c2 and the opening 24a are 3 mm or more, and are about 5 mm to 20 mm, which is ⅛ of the surface wave wavelength $\lambda$ of the microwave in the plasma.

The technical meaning that the diameters of the diameter-enlarged portion 24c2 and the opening 24a are 3 mm or more and ⅛ or less of the surface wave wavelength $\lambda$ of the microwave in the plasma will be described. For example, when the diameters of the diameter-enlarged portion 24c2 and the opening 24a are ¼ of the surface wave wavelength $\lambda$ of the microwave in the plasma, the surface wave of the microwave stops at the opening 24a and cannot propagate further. In other words, the diameter-enlarged portion 24c2 and the opening 24a function to prevent the surface wave of the microwave from propagating ahead of the opening. In this case, since the surface wave of the microwave is totally reflected at the opening 24a, the electric field strength of the microwave becomes maximum near the opening 24a. When the electric field strength of the microwave exceeds a critical value, arc discharge may occur, resulting in abnormal discharge.

On the other hand, when the diameter of the opening 24a is ⅛ of the surface wave wavelength $\lambda$ of the microwave in the plasma, the surface wave of the microwave can pass through the opening 24a. In this case, the surface wave of the microwave does not stop at the opening 24a, and the pressure difference between the internal pressure of the diameter-enlarged portion 24c2 and the pressure in the plasma generating space 22d is small. Therefore, the strong electric field of the microwave hardly enter the diameter-enlarged portion 24c2, and the occurrence of abnormal discharge in the diameter-enlarged portion 24c2 can be prevented. Hence, the diameters of the diameter-enlarged portion 24c2 and the opening 24a need to be ⅛ of the surface wave wavelength $\lambda$ of the microwave in the plasma, i.e., 20 mm or less.

On the other hand, when the diameter of the opening 24a is less than 3 mm, the surface wave of the microwave can pass through the opening 24a. However, the pressure difference between the internal pressure of the diameter-enlarged portion 24c2 and the pressure in the plasma generating space 22d increases. As a result, abnormal discharge is more likely to occur in the diameter-enlarged portion 24c2. Hence, the diameters of the diameter-enlarged portion 24c2 and the opening 24a should be 3 mm or more. Accordingly, it is possible to prevent abnormal discharge from occurring at the tip of the gas hole 24c and its vicinity.

Next, the function of the protruding portion 24 as a plasma ignition source will be described. In the case of igniting plasma using microwaves as in the plasma source 1, the ignition performance is determined by discharge electric field $E_{bd}$ expressed by Eq. (1).

$$E_{ba} = Dp^m \left[1 + \frac{(2\pi f)^2}{(Kp)^2}\right]^{1/2} \quad \text{Eq. (1)}$$

On the other hand, in a parallel plate type plasma processing apparatus such as the second chamber 10, due to discharge by high-frequency power between the lower electrode and the upper electrode, according to Paschen's law, the ignition performance is determined by discharge voltage Vbd expressed by Eq. (2).

$$V_{bd} = \left(\frac{Bpd}{\ln(Apd) - \ln[\ln(1 + 1/\gamma_{se})]}\right) \quad \text{Eq. (2)}$$

D and K in Eq. (1) are coefficients determined by gas type; p is a pressure in the chamber; and f is a frequency of the electromagnetic wave. m is a constant (approximately 0.5) determined by gas type. In addition, A and B in Eq. (2) are coefficients determined by gas type; p is a pressure in the chamber; d is a distance between the lower electrode and the upper electrode; and $\gamma_{se}$ is a secondary electron emission coefficient. The secondary electron emission coefficient is a coefficient determined by materials and surface conditions of the lower electrode and the upper electrode.

In other words, in the plasma source 1, Paschen's law is not valid for plasma ignition. Therefore, in the plasma source 1, the ignition performance is not determined by the discharge voltage Vbd expressed by Eq. (2). In the plasma source 1, if the discharge electric field Ebd expressed by Eq. (1) increases, ignition becomes easier. Hence, the protruding portion 24 of the plasma source 1 has a shape and arrangement for facilitating ignition specific to microwaves and VHF waves of 150 MHz or higher, thereby facilitating plasma ignition in the first chamber 22.

When the microwaves are radiated into the first chamber 22 in a state where no plasma is generated in the first chamber 22, the radiated microwaves are reflected by the conductor 24d in the protruding portion 24 and the reflection waves of the microwaves return to the first wall 22a. Then, a standing wave is generated between the incident wave of the microwave outputted from the dielectric window 38 and the reflected waves reflected by the protruding portion 24. Since the first chamber 22 is flat and the space between the first wall 22a and the second wall 22b is narrow, a high electric field is generated in the first chamber 22, facilitating plasma ignition. On the other hand, after the plasma ignition, the electric field between the protruding portion 24 and the inner wall of the first wall 22a does not increase.

This shows that the protruding portion 24 is a passive ignition source and, although a voltage is not applied thereto, the donut-shaped conductor 24d functions as an internal electrode, and the microwaves can be reflected by the conductor 24d. The outer diameter of the conductor 24d is 10 mm or more and 28 mm or less.

The diameter of the opening 24a of the gas hole 24c is 3 mm or more and ⅛ or less of the surface wave wavelength λ of the microwave in the plasma, for example, 4 mm. Therefore, the lower limit of the outer diameter of the conductor 24d is set to 10 mm or more so as to function as a passive ignition source while being a size sufficient for the size of the opening 24a. Also, the upper limit of the outer diameter of the conductor 24d is preferably equal to or less than the inner diameter of the slot S provided for introducing microwaves so as not to weaken the electric field strength and deteriorate the ignitability. Therefore, the upper limit of the outer diameter of the conductor 24d is set to 28 mm or less.

(Modification of Protruding Portion)

The protruding portion 24 is not limited to the configuration shown in FIG. 2. For example, a modification of the protruding portion 24 will be described with reference to FIG. 6. In the protruding portion 24 according to the modification, the entire columnar portion may be formed of a conductor 24e, and the periphery of the conductor 24e may be covered with a dielectric 24f such as alumina or the like. In this case as well, the gas hole 24c is formed inside the protruding portion 24, the gas hole 24c has the thin hole 24c1 and the diameter-enlarged portion 24c2, and the opening 24a formed at the tip of the gas hole 24c opens from the diameter-enlarged portion 24c2 toward the dielectric window 38. The thin hole 24c1 and the diameter-enlarged portion 24c2 of the gas hole 24c have the same size as those of the protruding portion 24 in FIG. 2. The horizontal distance from the tip of the conductor 24e to the bottom surface of the dielectric window 38 is also the same as that of the conductor 24d in FIG. 2. By coating the conductor 24e with the dielectric 24f, the plasma resistance of the protruding portion 24 can be enhanced, and the consumption and deterioration due to the plasma can be suppressed. The configuration of the modification of the protruding portion 24 can also facilitate the plasma ignition and improve the efficiency of gas decomposition. The shape of the tip of the protruding portion 24 shown in FIGS. 2 and 6 may be a rounded shape with chamfered corners.

Figure 6:
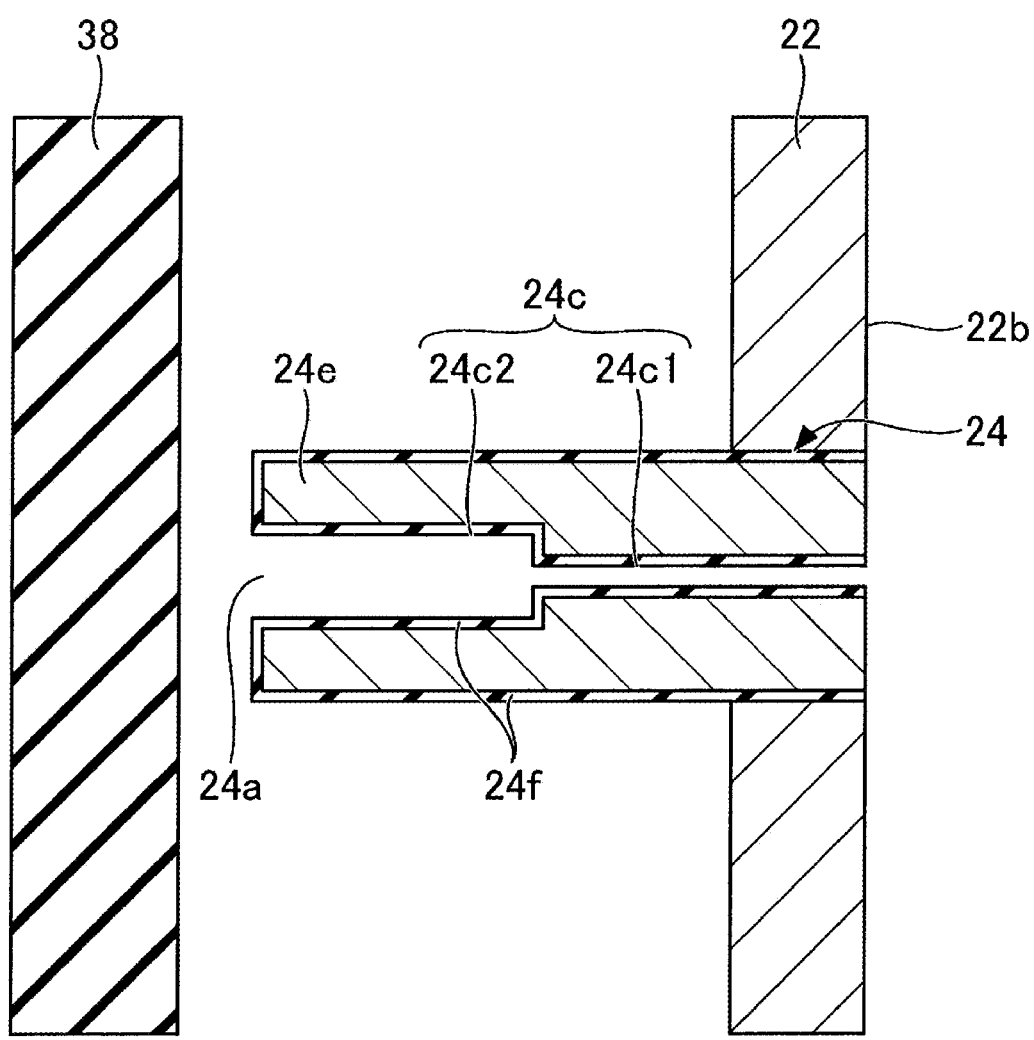
FIG. 6 is a diagram showing a modification of a protruding portion.

The conductor 24d shown in FIG. 2 and the conductor 24e shown in FIG. 6 of the protruding portion 24 function as floating electrodes.

The distance between the inner walls of the first wall 22a and the second wall 22b is 10 to 100 times the skin depth of the plasma. The reason why the distance is in the range of 10 to 100 times is that the plasma conductivity described below changes considerably depending on the plasma density. In the present embodiment, the distance between the inner walls of the first wall 22a and the second wall 22b is about 20 mm (see FIG. 1).

The skin depth varies depending on (1) frequency, (2) electron density, and (3) collision frequency of electrons and neutral particles. Here, (3) the collision frequency of electrons and neutral particles is determined by gas types and an electron temperature. The skin depth δ is calculated by Eq. (3).

$$\text{Skin depth } \delta = [2/(\omega\mu_0\sigma_{dc})]^{1/2} \quad \text{Eq. (3)}$$

Here, ω is a power frequency, $\mu_0$ is a permeability in a vacuum, and $\sigma_{dc}$ is a plasma conductivity. The plasma conductivity is calculated by Eq. (4).

$$\text{Plasma conductivity } \sigma_{dc} = e^2 n_e/(m\nu_m) \quad \text{Eq. (4)}$$

Here, e is an elementary charge, $n_e$ is an electron density, m is an electron mass, and $\nu_m$ is an electron-neutral particle collision frequency.

When the distance between the inner walls of the first wall 22a and the second wall 22b is 10 times the skin depth, the distance is about 20 mm at the microwave frequency of 800 MHz, about 28 mm at the microwave frequency of 400 MHz, and about 12 mm at the microwave frequency of 2.45 GHz. Accordingly, it is possible to realize the plasma source 1 with a low plasma electron temperature and a high electron density. The pressure in the first chamber 22 is 0.5 Torr or higher.

In the plasma source 1 according to the first embodiment described above, by reducing the thickness of the first chamber 22 and providing the protruding portion 24, plasma ignition can be facilitated, the efficiency of generating plasma in the first chamber 22 can be increased, and the stable range of plasma generation can be widened. In addition, by concentrating the region having a high electron temperature and a high electron density in the region to which the electromagnetic waves are supplied in the plasma generating space, the efficiency of gas decomposition and the efficiency of generating radicals can be improved. In particular, by injecting the reducing gas from the central portion of the protruding portion 24 and blowing it onto the central portion of the dielectric window 38 where the energy of the electromagnetic wave is concentrated, the efficiency of the reducing gas decomposition can be maximized.

Second Embodiment (Plasma Processing Apparatus)

Figure 7:
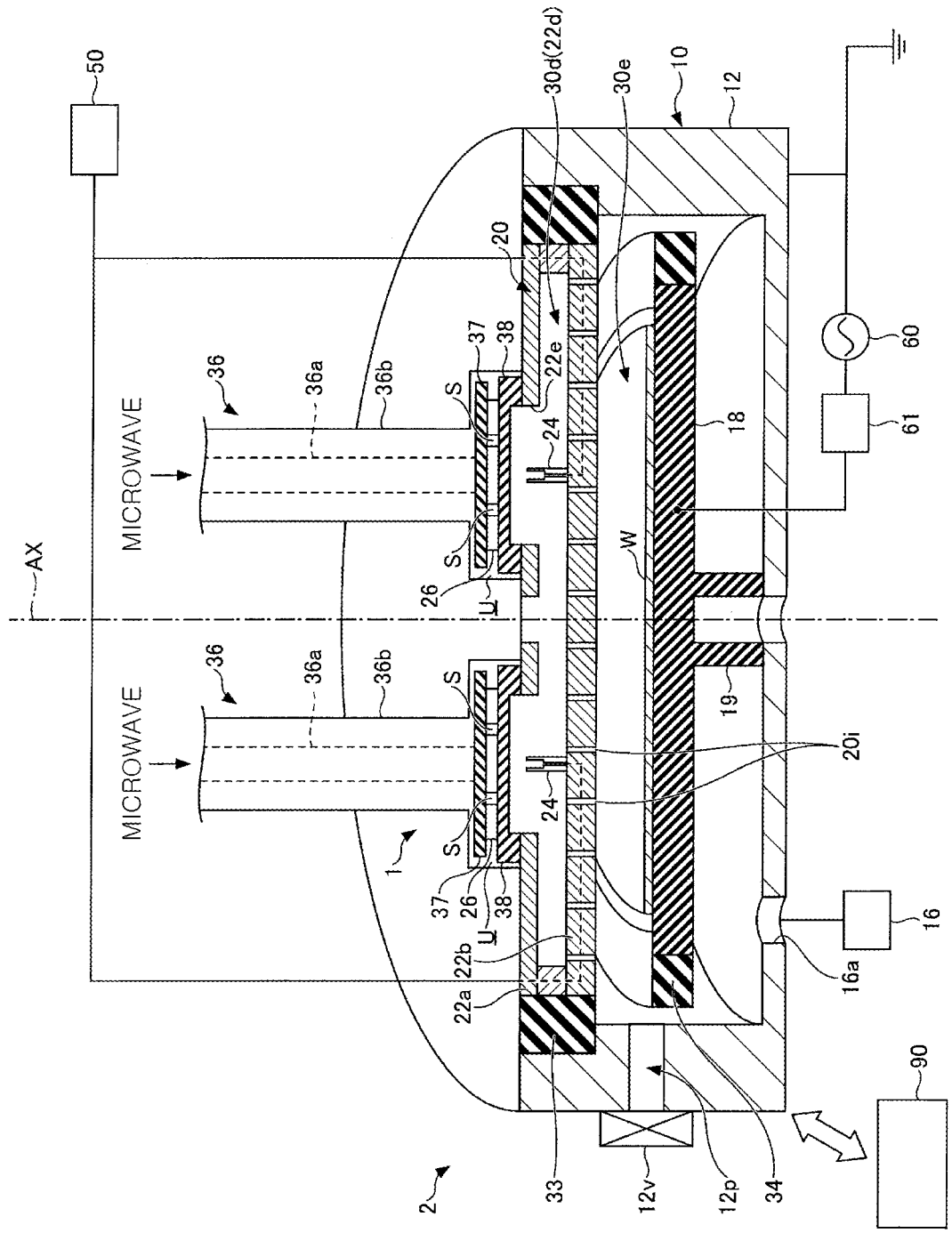
FIG. 7 is a cross-sectional view showing a plasma processing apparatus according to a second embodiment.

Next, a plasma processing apparatus 2 according to a second embodiment will be described with reference to FIG. 7. FIG. 7 is a cross-sectional view showing the plasma processing apparatus 2 according to the second embodiment. Reference numerals attached to each component in FIG. 7 indicate the same configuration when the same reference numerals as the reference numerals attached to each component in FIG. 1 are used.

In the second embodiment, the plasma source 1 is disposed above the plasma processing apparatus 2. The plasma source 1 is integrated with the shower head 20, and the first chamber 22 of the first embodiment corresponds to the shower head 20 of the second embodiment. In other words, the plasma source 1 includes the diffusion chamber 30d in the shower head 20 as the plasma generating space, the electromagnetic wave supply 36, and the protruding portion 24. An example of the plasma generator includes the diffusion chamber 30d and the electromagnetic wave supply 36. The plasma generator of the first embodiment is disposed outside the plasma processing apparatus 2, whereas the plasma generator of the second embodiment is partially disposed inside the plasma processing apparatus 2.

In case the first wall 22a and the second wall 22b are two facing walls that have the largest area among the wall surfaces constituting the diffusion chamber 30d, in the second embodiment, the upper wall of the shower head 20 is the first wall 22a, and the lower wall of the shower head 20 is the second wall 22b. The opening 22e is formed at the first wall 22a. The dielectric window 38 is disposed on the first wall 22a to block the opening 22e, and transmits electromagnetic waves to the diffusion chamber 30d corresponding to the plasma generating space 22d. The dielectric window 38 is disposed at the tip of the electromagnetic wave supply 36.

The protruding portion 24 is disposed on the second wall 22b, protrudes from the second wall 22b so as to be adjacent to the dielectric window 38, and at least partially contains a conductor. The protruding portion 24 may have the same configuration and function as those of the protruding portion 24 shown in any one of FIGS. 2 and 6. Since the configuration and function of the protruding portion 24 have been described above, the description thereof will be omitted.

The gas hole of the protruding portion 24 is connected to the gas supply 50, and supplies the reducing gas from the gas supply 50 to the plasma generating space 22d. In the plasma generating space 22d, the electric field of the electromagnetic waves supplied from the electromagnetic wave supply 36 decomposes the reducing gas supplied from the gas hole of the protruding portion 24 to generate plasma. The plurality of gas through-holes 20i are formed in the second wall 22b in the thickness direction of the second wall 22b and penetrate through the second wall 22b. The radicals in the plasma generated in the plasma generating space 22d are supplied to the processing chamber 30e through the plurality of gas through-holes 20i and used for processing the substrate W.

The plasma processing apparatus 2 includes the second chamber 10. In the embodiment, the second chamber 10 has the chamber body 12. The chamber body 12 has a substantially cylindrical shape, and opens at its upper portion. The chamber body 12 provides the sidewall and the bottom portion of the second chamber 10. The chamber body 12 is made of metal such as aluminum or the like. The chamber body 12 is grounded.

The outer circumference of the shower head 20 is covered with the dielectric member 33 made of aluminum oxide or the like. The outer circumference of the substrate support 18 is covered with the dielectric member 34 made of aluminum oxide or the like. The upper opening of the chamber body 12 is closed by the shower head 20 and the dielectric member 33.

The plasma processing apparatus 2 further includes the substrate support 18. The substrate support 18 is disposed in the second chamber 10. The substrate support 18 is configured to support the substrate W placed thereon. The substrate W is placed on the substrate support 18 in a substantially horizontal state.

The high-frequency power supply 60 is connected to the substrate support 18 via the matching device 61. The bottom portion of the second chamber 10 provides the exhaust port 16a, and the exhaust port 16a is connected to the exhaust device 16.

The portion of the shower head 20 corresponding to the plasma generating space 22d has a thickness of 20 mm, for example. In the plasma source 1 according to the second embodiment described above, by reducing the thickness of the shower head 20 and providing the protruding portion 24, plasma ignition can be facilitated, the efficiency of generating plasma in the diffusion chamber 30d can be increased, and the stable range of plasma generation can be widened. In addition, by concentrating a region having a high electron temperature and a high electron density in a region to which the electromagnetic waves are supplied in the plasma generating space, the efficiency of gas decomposition and the efficiency of generating radicals can be improved. In particular, by injecting the reducing gas from the central portion of the protruding portion 24 and blowing it onto the central portion of the dielectric window 38 where the energy is concentrated, the efficiency of the reducing gas decomposition can be maximized.

In the plasma source 1 and the plasma processing apparatus 2 according to the first and second embodiments, the plasma ignition can be facilitated and the efficiency of gas decomposition can be improved.

The plasma source and the plasma processing apparatus according to the embodiments disclosed in the present disclosure should be considered as examples and not restrictive in all respects. The embodiments can be modified and improved in various forms without departing from the scope of the appended claims and the gist thereof.

By providing the protruding portion 24, it is possible to eliminate the need to move the matching position and shorten the time for turning on the plasma. Accordingly, plasma ignition can be performed quickly after the gas is exchanged, which is suitable for an atomic layer deposition (ALD) process, and the productivity can be increased. However, it can also be applied to film formation using a chemical vapor deposition (CVD) method. The substrate processing performed by the plasma processing apparatus of the present disclosure may include film formation, etching, or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma source comprising:
   a plasma generator including a first wall having an opening and a second wall facing the first wall, and forming a plasma generating space;
   a dielectric window disposed on the first wall to block the opening and configured to transmit electromagnetic waves to the plasma generating space; and
   a protruding portion disposed on the second wall, protruding from the second wall to be close to the dielectric window, and containing a conductor at least partially,
   wherein the protruding portion has a gas hole that opens toward the dielectric window.

2. The plasma source of claim 1, wherein an end surface of the gas hole is enlarged in diameter.

3. The plasma source of claim 1, wherein the protruding portion is made of a dielectric.

4. The plasma source of claim 3, wherein the conductor is embedded in the dielectric.

5. The plasma source of claim 4, wherein the conductor is embedded in an outer periphery of the gas hole near an end surface of the gas hole, and is not exposed to the gas hole.

6. The plasma source of claim 1, wherein the conductor has a donut shape.

7. The plasma source of claim 6, wherein an outer diameter of the conductor is 10 mm or more and 28 mm or less.

8. The plasma source of claim 1, wherein the protruding portion is made of a conductor, and an outer periphery of the conductor is coated with a dielectric.

9. The plasma source of claim 1, wherein a distance between the first wall and the second wall is 10 to 100 times a skin depth of plasma.

10. The plasma source of claim 1, wherein the plasma source is disposed above a plasma processing apparatus via a connecting portion,
    the plasma processing apparatus includes a processing chamber for processing a substrate, and
    the plasma generator is disposed outside the plasma processing apparatus, and supplies plasma generated from gas supplied from the gas hole by the electromagnetic waves to the processing chamber through the connecting portion.

11. The plasma source of claim 1, wherein a plurality of through-holes are formed in the second wall.

12. The plasma source of claim 11, wherein the plasma source is disposed above a plasma processing apparatus,
    the plasma processing apparatus includes a processing chamber for processing a substrate, and
    the plasma generator is partially disposed inside the plasma processing apparatus, and supplies plasma generated from gas supplied from the gas hole by the electromagnetic waves to the processing chamber through the plurality of through-holes.

13. A plasma processing apparatus having comprising the plasma source of claim 1.

* * * * *